United States Patent [19]

Ikeda

[11] Patent Number: 5,132,650

[45] Date of Patent: Jul. 21, 1992

[54] LC NOISE FILTER

[76] Inventor: Takeshi Ikeda, 2-5-6-213, Sanno, Ohta-ku, Tokyo, Japan

[21] Appl. No.: 510,189

[22] Filed: Apr. 17, 1990

[30] Foreign Application Priority Data

Apr. 20, 1989 [JP] Japan .................................. 1-101426

[51] Int. Cl.$^5$ .......................... H03H 7/01; H03H 7/09
[52] U.S. Cl. ................................... 333/187; 333/185;
336/200
[58] Field of Search ................. 333/12, 172, 174, 177,
333/181, 184, 185, 204, 246; 336/200, 232;
361/400-402

[56] References Cited

U.S. PATENT DOCUMENTS

| 3,833,872 | 9/1974 | Marcus et al. | 336/200 X |
|---|---|---|---|
| 4,117,438 | 9/1978 | Kim et al. | 336/200 X |
| 4,201,965 | 5/1980 | Onyshkevych | 336/200 X |
| 4,253,079 | 2/1981 | Brosh | 336/200 X |
| 4,313,152 | 1/1982 | Vranken | 336/232 X |
| 4,494,100 | 1/1985 | Stengel et al. | 336/200 |
| 4,614,925 | 9/1986 | Kane | 333/185 X |
| 4,728,911 | 3/1988 | Sjögren | 333/185 X |
| 4,888,568 | 12/1989 | Kawaguchi | 333/185 X |

FOREIGN PATENT DOCUMENTS

| 0097647 | 8/1977 | Japan . | |
|---|---|---|---|
| 0067158 | 5/1980 | Japan | 336/200 |
| 60-006361 | 7/1986 | Japan . | |
| 0053011 | 3/1987 | Japan | 333/181 |
| 0233911 | 10/1987 | Japan . | |
| 62-059764 | 9/1988 | Japan . | |
| 0030314 | 2/1989 | Japan | 333/185 |
| 1177884 | 9/1985 | U.S.S.R. | 333/185 |

Primary Examiner—Eugene R. LaRoche
Assistant Examiner—Seung Ham
Attorney, Agent, or Firm—Oliff & Berridge

[57] ABSTRACT

A distributed constant type LC noise filter includes a swirl-like induction conductor formed on a substrate at one side, and at least one grounding block conductor formed on the substrate at the other side in a position opposed to a portion of the induction conductor, providing an improved attenuation throughout a widened range of frequency.

17 Claims, 13 Drawing Sheets

LC NOISE FILTER

BACKGROUND OF THE INVENTION

1. Field of the Invention

The present invention relates to improvements of a distributed constant type LC noise filter.

2. Description of the Prior Art

There is known a noise filter which comprises an insulation substrate 10 of ceramic or other material, a swirl-like induction conductor 12 formed on the substrate at one side 10a and a ground conductor 14 formed on the same substrate at the other side 10b, as shown in FIGS. 16A and 16B.

This noise filter functions as an LC noise filter which provides an inductance $L_1$ at the swirl-like induction conductor 12 and at the same time a distributed constant type electrostatic capacitance C between the swirl-like induction conductor 12 and the ground conductor 14.

However, such as LC noise noise filter raises the following problems:

(a) First Problem:

The noise filter could not provide an expected capacitance C between the induction conductor 12 and the ground conductor 14. Further, the noise filter could have its electrical characteristics only in a level inferior to those of a lumped constant type LC noise filter.

In particular, as the frequency of signals applied to the induction conductor 12 increases, the inductance thereat is changed from one level to another while decreasing the capacitance C between the induction conductor 12 and the ground conductor 14. This results in insufficient function in the LC noise filter.

(b) Second Problem:

If the noise filter is used in a signalling circuit, signals are applied to the opposite electrodes 16 and 18 of the induction conductor 12 to eliminate noise from these signals. When the frequency of signals to be applied increases, a line-to-line short-circuit is induced at the swirl-like induction conductor 12, as shown by arrow B in FIG. 16A. This line-to-line short-circuit impairs the function of the inductor conductor 12 as an inductor. Since such a line-to-line short-circuit is more frequently created as the frequency of signals to be applied increases, the prior art noise filter could not be used as a high-frequency noise filter.

SUMMARY OF THE INVENTION

In view of these problems in the prior art, it is an object of the present invention to provide a distributed constant type noise filter having electrical characteristics superior to the prior art noise filter in overcoming the aforementioned problems (a) and (b).

To this end, the present invention provides an LV noise filter comprising:

a dielectric;

a swirl-like induction conductor formed on the dielectric at one side; and at least one grounding block conductor formed on the dielectric at the opposite side, overlapping on a portion of the induction conductor.

In order to attain the same purpose, the LC noise filter of the present invention is characterized by a shield conductor for preventing a line-to-line short-circuit in the induction conductor.

The function of the LC noise filter will be described below.

The inventors had studied why the LC noise filter as shown in FIG. 16 could not provide an expected capacitance C between the induction conductor 12 and the grounding conductor 14. On the assumption that this is due to a short-circuit current flowing in the ground conductor 14, it had been determined whether or not the inductance $L_1$ and capacitance C actually functioned in an LC noise filter shown in FIG. 17.

This LC noise filter comprises a swirl-like induction conductor 12 and a ground conductor 14, these conductors being coupled with each other in both an electrostatically capacitive coupling manner and an inductive coupling manner. Therefore, an electromotive force is induced also in the ground conductor 14 from a magnetic flux created when the induction conductor 12 is energized. This electromotive force will produce a short-circuit current as shown by solid line A in FIG. 16B.

(a) Investigation of Capacitance:

It will not be investigated why an expected capacitance C is not obtained between the induction conductor 12 and the ground conductor 14.

If the swirl-like induction conductor 12 is used as a primary winding in a transformer, the ground conductor 14 then functions as a secondary short-circuited winding. Even if the ground conductor 14 is formed flat on a plane surface, it will produce an unexpected high inductance component.

Accordingly, an exact equivalent circuit in the prior art LC noise filter of FIG. 16 is that shown in FIG. 18, rather than FIG. 17. In FIG. 18, $L_1$ is an inductance in the induction conductor 12; $L_E$ is an inductance in the ground conductor 14; and C is a distributed constant type capacitance between the two conductors 12 and 14.

It is now assumed that the capacitance C shares in three lumped capacitors Ca, Cb and Cc. If the inductance $L_E$ in the ground conductor 14 increases, the capacitors Cb and Cc remote from a ground terminal 20 are prevented from being energized under the presence of the inductance $L_E$. Therefore, only the capacitor Ca nearer the ground terminal 20 of the ground conductor 14 will function as a capacitor for the noise filter.

Accordingly, the prior art noise filter will provide only one capacitance Ca on operation. It is believed that this is a cause that does not provide a desired capacitance C expected from the structure of the LC noise filter.

Since a substantial capacitance is provided only at a position nearer the ground terminal 20 of the ground conductor 14, the substantial property of the noise filter will not almost be varied even if the area of the ground conductor 14 shown in FIG. 16B is reduced to one-half or one-third. Therefore, the prior art LC noise filter was very difficult to provide a desired level of capacitance C.

(b) Invenstigation of Inductance:

The inductance of the induction conductor 12 will be discussed below.

As previously described, the LC noise filter comprises a swirl-like induction conductor 12 and a ground conductor 14 coupled therewith in an electrostatically capacitive manner and at the same time an inductive manner. In addition to its self-inductance $L_1$, therefore, the induction conductor 12 will be subjected to a mutual inductance M between the induction conductor 12 and the ground conductor 14. Particularly, if the area of the ground conductor 14 is increased as in the prior art, the magnetude of the mutual inductance M becomes too large. It is believed that this causes the induction conductor 12 to function insufficiently as an inductor in the LC noise filter.

In the prior art, the flat ground conductor 14 is located wholly opposed to the swirl-like induction conductor 12. In such an arrangement, the ground conductor 14 will block the magnetic path in the induction conductor 12 to increase its magnetic reluctance. The increase of magnetic reluctance prevents a desired inductance from being provided by the induction conductor 12. This results in reduction of the functional property of the noise filter.

As will be apparent from the investigation (a) and (b), the LC noise filter constructed according to the prior art cannot provide sufficient capacitance and inductance in the whole circuit to have its characteristics inferior to the lumped constant type LC noise filters.

(c) Investigation of the Present Invention:

In view of the above fact, the inventor has studied the manner in which an LC noise filter having an improved property was obtained by forming a ground conductor functioning as a capacitor on a dielectric at one side in a position relative to a swirl-like induction conductor on the other side of the dielectric.

The inventors have found that the LC noise filter could be improved by providing at least one grounding block conductor on the dielectric at a position opposite to a portion of the induction conductor.

Since the grounding block conductor has such a small area as to provide a decreased self-inductance, a capacitance produced between the grounding block conductor and the induction conductor can be used to provide a capacitance in the noise filter as it is.

Since the grounding block conductor is located opposed to only a portion of the induction conductor, a mutual inductance between the induction conductor and the grounding block conductor can be almost ignored. Thus, the present invention can provide an LC noise filter which does not include such a mutual inductance as degrades the property of the noise filter.

Furthermore, the grounding block conductor will not block the magnetic path in the induction conductor. Thus, the inductance in the induction conductor will not be reduced.

Experiments showed that an LC noise filter constructed according to the present invention and having only a grounding block conductor had a very superior property to that of the prior art LC noise filter shown in FIG. 16. If a plurality of grounding block conductors are located in the LC noise filter according to the principle of the present invention, each of the grounding block conductors forms a capacitor which practically functions between the grounding block conductor and the induction conductor. In such a manner, the present invention can provide an LC noise filter having a desired capacitance by the use of any number of grounding block conductors.

The use of plural grounding block conductors is also capable of providing an LC noise filter with a property similar to that of the distributed constant type, which could not be accomplished by the prior art.

The inventor has further found that a superior attenuation can be provided by arranging at least one grounding block conductor at a position electrically nearer the input or output terminal of the induction conductor.

If a plurality of grounding block conductors are to be used in an LC noise filter, it its possible to dispose one of the grounding block conductors close to the input terminal of the induction conductor and to arrange another of the grounding block conductors close to the output terminal of the induction conductor while the remaining grounding block conductors are located opposed to each other at the other positions.

If a shield conductor is provided between adjacent winds of a swirl-like induction conductor to prevent a line-to-line short-circuit in the induction conductor, it has been found that the induction conductor functioning as an inductor will be produce any line-to-line short-circuit in the high-frequency region as in the prior art.

Thus, the present invention can provide an LC noise filter which has electrically improved characteristics throughout a very widened frequency region.

DETAILED DESCRIPTION OF THE PREFERRED EMBODIMENTS

Figure 1A:
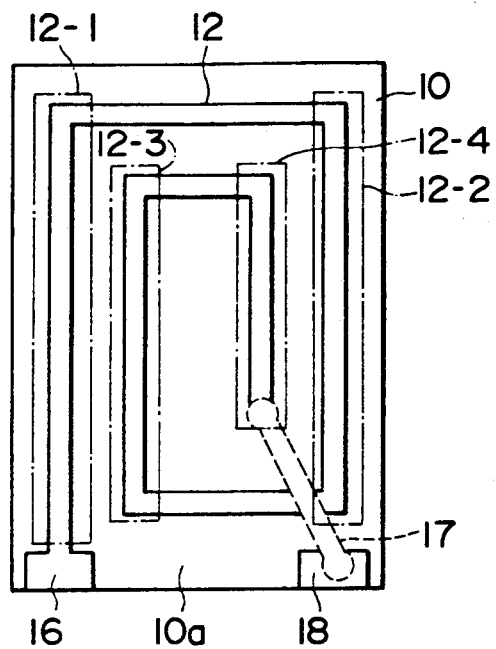
FIGS. 1A and 1B illustrate the front and back sides of a substrate to which the first preferred embodiment of a distributed constant type LC noise filter constructed according to the present invention is applied.

The present invention will now be described in detail in connection with some preferred embodiments thereof which are illustrated in the drawings.

First Embodiment

Figure 1B:
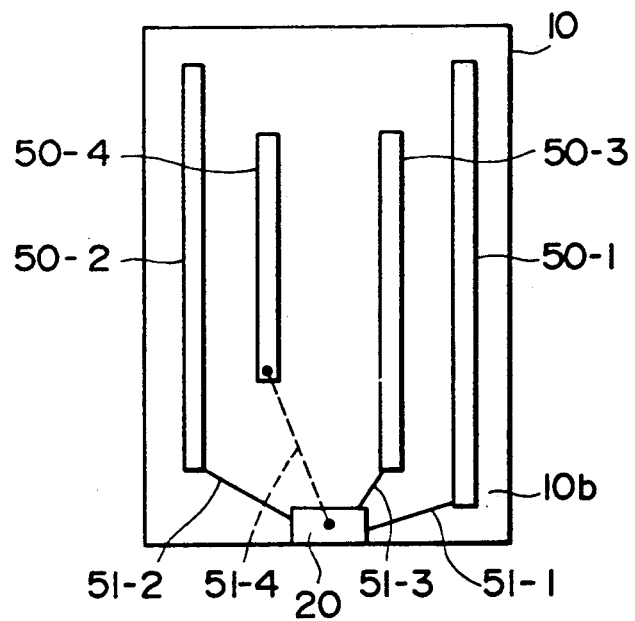

FIGS. 1A and 1B shows the first preferred embodiment of a distributed constant type LC noise filter constructed according to the present invention.

Referring now to FIG. 1A, there is shown an LC noise filter which comprises an insulative substrate 10 of ceramic or other material and an induction conductor 12 formed into a swirl configuration on the substrate 10 at one side 10a, the induction conductor 12 functioning as an inductor. The swirl-like induction conductor 12 is connected, at its outer end, directly with a terminal 16. The inner end of the induction conductor 12 is connected with another terminal 18 through a jumper wire or line 17.

As shown in FIG. 1B, the first feature of the present invention resides in that at least one grounding block conductor 50 is formed on the insulative substrate 10 at the other side 10b in a position opposite to a portion of the induction conductor 12.

In the illustrated embodiment, there are provided four grounding block conductors 50-1, 50-2, 50-3 and 50-4 on the insulative substrate 10.

It is preferred that one of the grounding block conductors 50-1 through 50-4 is located opposed to the induction conductor 12 at a position electrically near the terminal 16 thereof and another grounding block conductor is disposed opposed to the induction conductor 12 at a position electrically near the other terminal 18 thereof.

In the illustrated embodiment, one of the grounding block conductors 50-1 is located opposed to a region 12-1 of the induction conductor 12 at a position electrically near the terminal 16 thereof. The grounding block conductor 50-4 is disposed opposed to another region 12-4 of the induction conductor 12 at a position electrically near the other terminal 18 thereof. The remaining block conductors 50-2 and 50-3 are positioned opposed to regions 12-2 and 12-3 of the induction conductor 12, respectively.

In order to provide a good attenuation, it is preferred that least the grounding block conductors 50-1 and 50-4 respectively located near the input and output terminals 16 and 18 are connected with a ground terminal 20 through leads 51-1 and 51-4 which are taken out from positions adjacent to these terminals 16 and 18.

Each of the block conductors 50-1, 50-2, 50-3 and 50-4 has a width slightly larger than that of the induction conductor 12.

Figure 2:
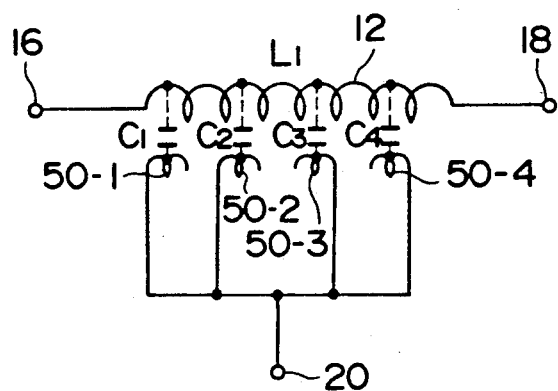
FIG. 2 is a circuit diagram of an equivalent circuit used in the noise filter of FIG. 1.

FIG. 2 shows an equivalent circuit usable in the LC noise filter illustrated in FIG. 1. In this circuit, the swirl-like induction conductor 12 functions as an inductor $L_1$. Each of the grounding block conductors 50-1, 50-2, 50-3 and 50-4 formed on the substrate 10 at the side opposite to the induction conductor 12 is electrostatically capacitive-coupled with the corresponding one of the regions 12-1, 12-2, 12-3 and 12-4 of the induction conductor 12 to form a capacitor $C_1$, $C_2$, $C_3$ or $C_4$.

Each of the grounding block conductors 50-1, 50-2, 50-3 and 50-4 is of a block configuration having a small area and connected with the ground terminal 20. Therefore, only a small eddy current will flow in each of the block conductors 50-1, 50-2, 50-3 or 50-4 to reduce its inductance, resulting in one of the capacitors $C_1$, $C_2$, $C_3$ or $C_4$ being coupled directly with the ground terminal 30. This will provide an LC noise filter of substantially distributed constant type in which a plurality of LC noise filter sections are connected together in series.

In accordance with the principle of the present invention, therefore, the increased number of grounding block conductors 50 can increase the capacitance C in the LC noise filter. On the other hand, the decreased number of grounding block conductors 50 can decrease the capacitance C in the LC noise filter.

In the above arrangement, a mutual inductance between an induction conductor region and the corresponding one of the grounding block conductors 50-1, 50-2, 50-3 or 50-4 can be substantially ignored since each of the grounding block conductors 50-1, 50-2, 50-3 or 50-4 having its reduced area is disposed opposed to only one region 12-1, 12-2, 12-3 or 12-4 of the induction conductor 12. This can greatly reduce the mutual inductance components resulting in degradation of the property of the noise filter.

The noise filter of the present invention is such that the grounding block conductors 50 will never block the magnetic path in the induction conductor 12.

More particularly, when the induction conductor 12 is energized, a magnetic flux is created to pass between the winds of the induction conductor 12 from one side to the other side or vice versa. If the block conductors 50 are positioned to block the magnetic path (e.g. each of the block conductors 50 being disposed opposed to an area between adjacent winds of the induction conductor 12), the magnetic path will be blocked completely by the block conductors 50, so that the induction conductor 12 will not function sufficiently as an inductor in the LC noise filter.

According to the principle of the present invention, each of the block conductors 50 is disposed opposed to only a portion of the induction conductor 12 not to block the magnetic path in the induction conductor 12. Thus, the inductance in the swirl-like induction conductor 12 will not be reduced. This causes the LC noise filter to perform its function fully.

If the terminals 16 and 18 of the induction conductor 12 are used as input and output terminals, the LC noise filter can be used as a normal mode type noise filter improved in electrical characteristics.

Although the first embodiment has been described with to each of the grounding block conductors 50-1, 50-2, 50-3 or 50-4 having a width larger than that of the corresponding region of the induction conductor 12 opposed thereto, the area, number and length of the grounding block conductors can be selected, if desired.

Second Embodiment

FIG. 3 shows the second preferred embodiment of an LC noise filter constructed according to the present invention.

Figure 3A:
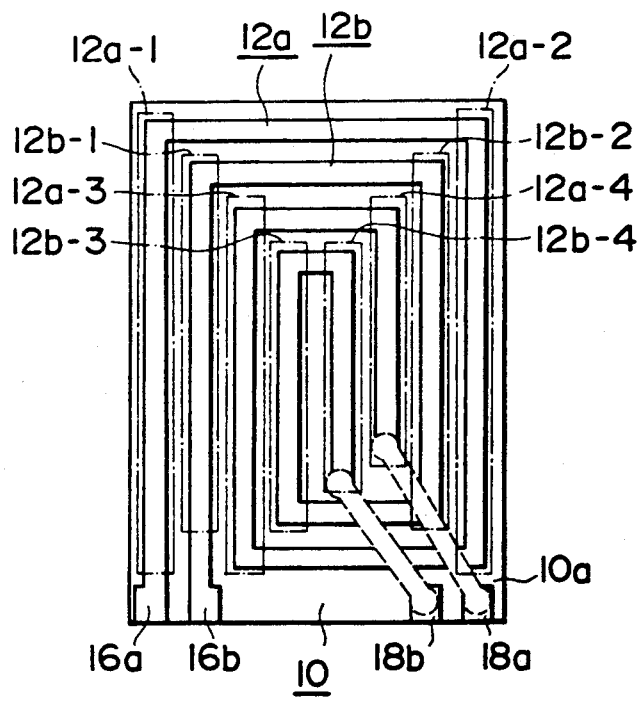
FIGS. 3A and 3B illustrate the front and back sides of a substrate to which the second preferred embodiment of a distributed constant type LC noise filter constructed according to the present invention is applied.

Referring to FIG. 3A, the LC noise filter comprises a substrate 10 and a pair of swirl-like induction conductors 12a and 12b which are formed on the substrate 10 at one side 10a.

Figure 3B:
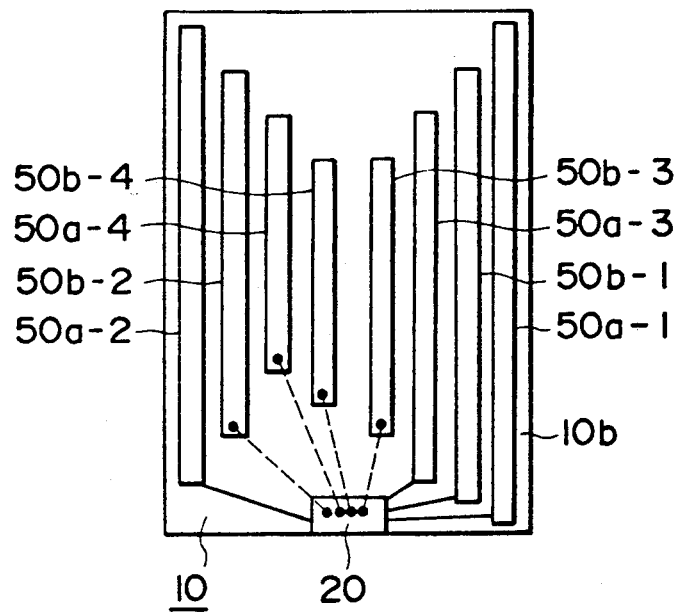

As seen from FIG. 3B, the other side 10b of the substrate 10 is formed with a group of grounding block conductors 50a-1, 50a-2, 50a-3 and 50a-4 each of which is located opposed to a portion 12a-1, 12a-2, 12a-3 or 12a-4 of one of the induction conductors 12a, as in the first embodiment. Similarly, another group of grounding block conductors 50b-1, 50b-2, 50b-3 and 50b-4 are formed on the other side 10b of the substrate 10 at positions opposed to the respective portions 12b-1, 12b-2, 12b-3 and 12b-4 of the other induction conductor 12b, as in the first embodiment.

FIG. 3B, the one induction conductor 12a includes input and output terminals 16a and 18a while the other induction conductor 12b includes input and output terminals 16b and 18b.

Figure 4:
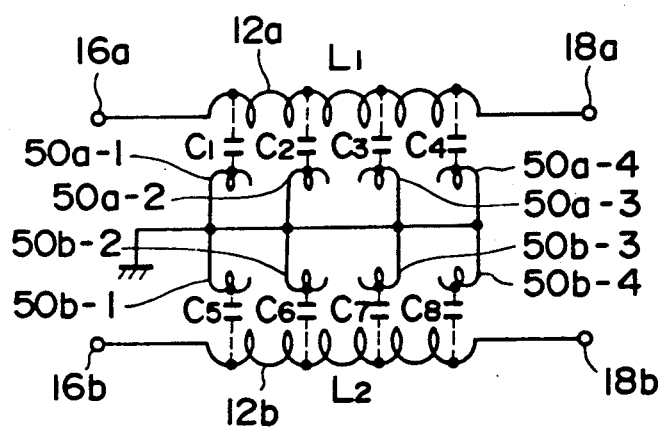
FIG. 4 is a circuit diagram of a equivalent circuit used in the noise filter of FIG. 3.

Referring next to FIG. 4, there is shown an equivalent circuit usable in the LC noise filter illustrated in FIGS. 3A and 3B, wherein the first swirl-like induction conductor 12a functions as the first inductor $L_1$ while the second swirl-like induction conductor 12b functions as the second inductor $L_2$.

The group of grounding block conductors 50a-1, 50a-2, 50a-3 and 50a-4 disposed ont he other side 10b of the substrate 10 co-operate with the first induction conductor 12a disposed on the one side 10a of the substrate 10 to form capacitors $C_1$, $C_2$, $C_3$ and $C_4$ in the distributed constant fashion without blocking the magnetic path in the first induction conductor 12a.

Similarly, the other group of grounding block conductors 50b-1, 50b-2, 50b-3 and 50b-4 disposed on the other side 10b of the substrate 10 co-operate with the second induction conductor 12a disposed on the one side 10a of the substrate 10 to form capacitors $C_1$, $C_2$, $C_3$ and $C_4$ in the distributed constant fashion without blocking the magnetic path in the second induction conductor 12a.

The second embodiment can function as a common mode type four-terminal noise filter having the distributed constant type circuit as shown in FIG. 4.

Although the second embodiment has been described as to four grounding block conductors 50 relative to each of the first and second induction conductors 12a and 12b, the present invention is not limited to such an arrangement. For example, the number of grounding block conductors 50 can be increased or decreased to provide a distributed constant type common mode noise filter having any desired capacitance.

Third Embodiment

The first and second embodiments of the present invention aforementioned can overcome the first problem previously described, but cannot deal with the second problem similarly previously described.

Figure 5A:
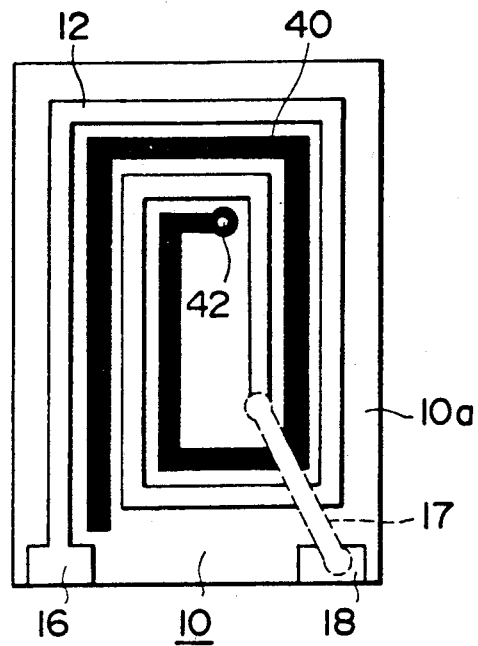
FIGS. 5A and 5B illustrate the front and back sides of a substrate to which the third embodiment of a distributed constant type LC noise filter constructed according to the present invention is applied.
Figure 5B:
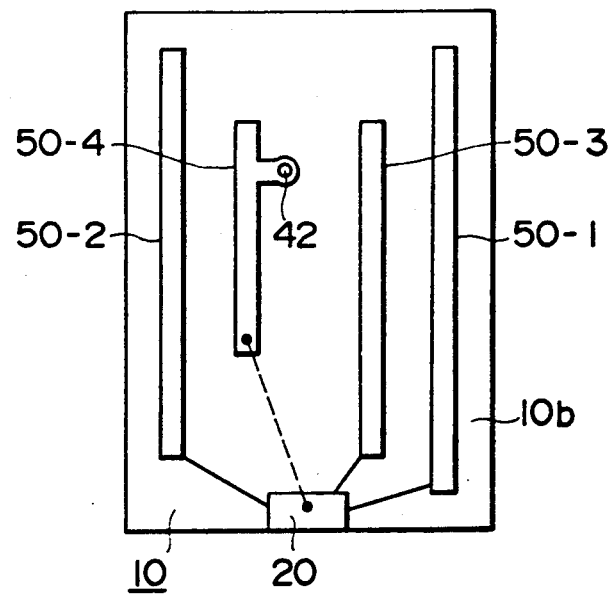
Figure 6:
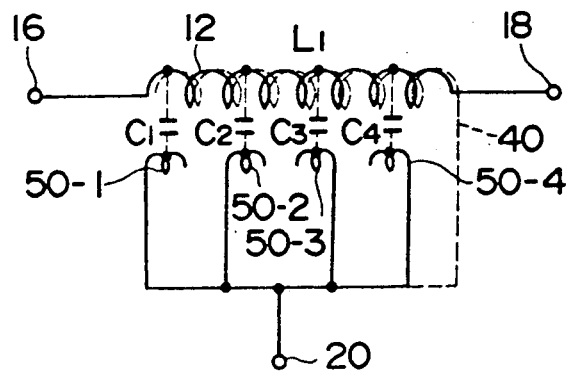
FIG. 6 is a circuit diagram of an equivalent circuit used in the noise filter of FIG. 5.

FIGS. 5 and 6 show the third preferred embodiment of the present invention which can overcome the second problem.

The third embodiment is characterized in that a noise filter as shown in FIG. 1 further comprises a swirl-like shield conductor 40 which is disposed on the side 10a of the substrate 10 between each adjacent wind of the induction conductor 12. The substrate 10 includes a through-hole 42 formed therein at the center, as shown in FIG. 50. The inner end of the shield conductor 40 is electrically connected with one of the grounding block conductors 50-4 on the other side 10b of the substrate 10 through the through-hole 42.

In such an arrangement, the noise filter can simultaneously overcome both the first and second aforementioned problems in the prior art and will function as a normal mode type three-terminal noise filter improved in electrical characteristics throughout an increased range of frequency, as shown in FIG. 6.

The provision of the shield conductor 40 not only prevents any line-to-line short-circuit in the induction conductor 12, but also improves the inductance in the induction conductor 12 as well as the capacitance between the induction conductor 12 and each of the grounding block conductors 50. Thus, the third embodiment can provide an attenuation superior to that of the first embodiment.

Fourth Embodiment

Figure 7A:
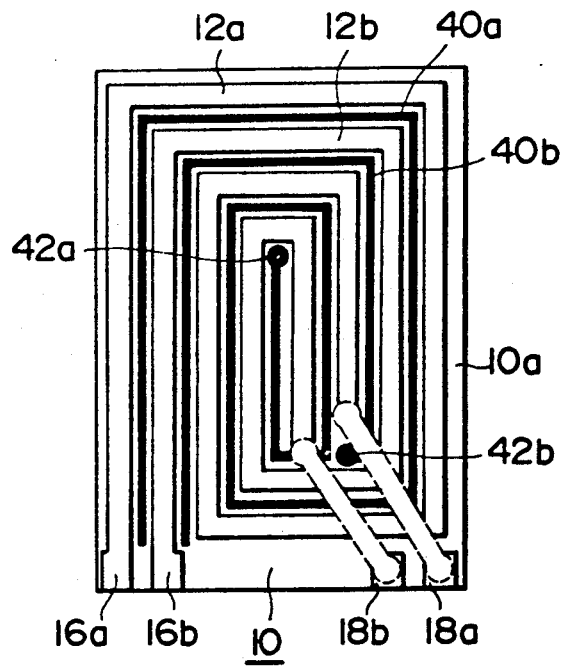
FIGS. 7A and 7B illustrate the front and back side of a substrate to which the fourth preferred embodiment of a distributed constant type LC noise filter constructed according to the present invention is applied.
Figure 7B:
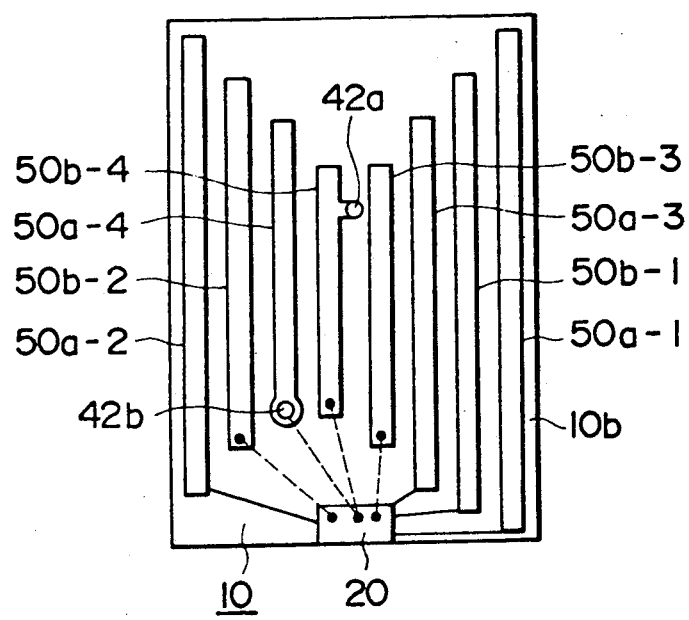

FIG. 7 shows the fourth preferred embodiment of an LC noise filter constructed according to the present invention.

The fourth embodiment is characterized in that a nose filter as shown in FIG. 3 further comprises a first swirl-like shield conductor 40a formed between the first and second induction conductors 12a and 12b and a second swirl-like shield conductor 40b similarly formed between the first and second induction conductors 12a and 12b.

Each of the first and second shield conductors 40a and 40b is electrically connected, at its inner end, with the corresponding one of grounding block conductors 50a and 50b on the side 10b of the substrate 10 through the corresponding one of through-holes 42a and 42b which are centrally formed in the substrate 10.

Figure 8:
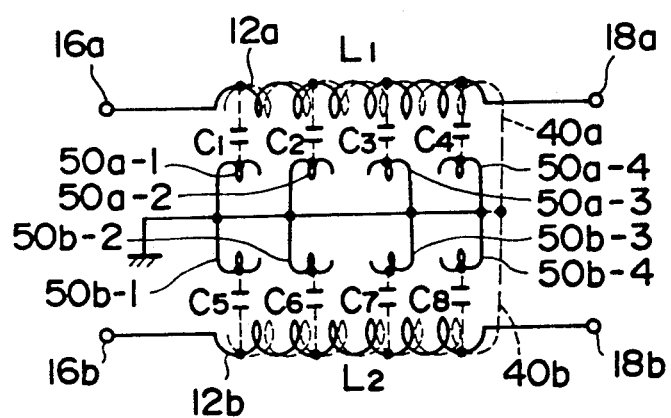
FIG. 8 is a circuit diagram of an equivalent circuit used in the noise filter of FIG. 7.

In such a manner, the fourth embodiment of the present invention can provide a common mode type four-terminal noise filter improved in electrical characteristics throughout an increased range of frequency, as shown in FIG. 8. Particularly, the fourth embodiment can provide an attenuation superior to that of the second embodiment.

Fifth Embodiment

FIG. 9 shows the fifth preferred embodiment of the present invention.

Figure 9A:
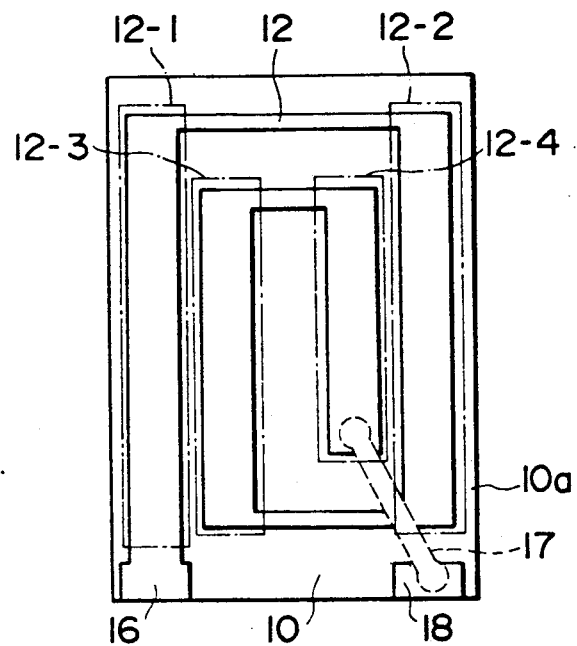
FIGS. 9A and 9B illustrate the front and back sides of a substrate to which the fifth preferred embodiment of a distributed constant type LC noise filter constructed according to the present invention is applied.
Figure 9B:
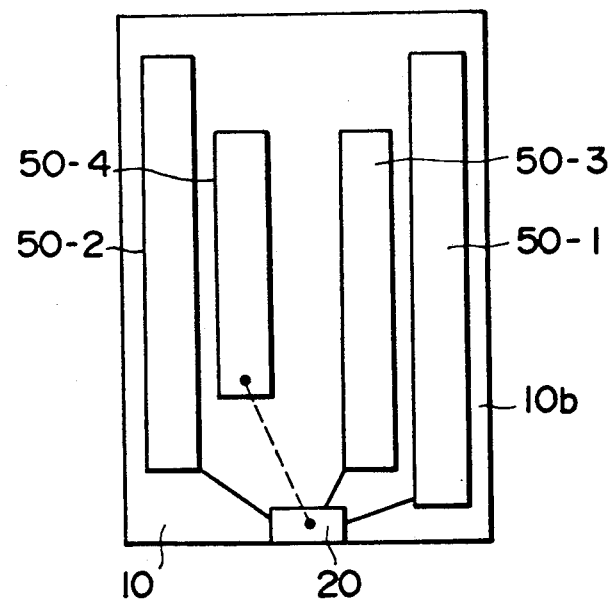

As seen from FIGS. 9A and 9B, the fifth embodiment is characterized by that it comprises grounding block conductors 50-1, 50-2, 50-3 and 50-4, each of which is formed to have a width larger than those of the previously described embodiments, and an induction conductor 12 including regions 12-1, 12-2, 12-3 and 12-4, each located opposite to the corresponding one of the grounding block conductors 50-1, 50-2, 50-3 and 50-4 and having a width larger than those of the previously described embodiments.

There is thus provided an increased area between each of the grounding block conductors 50-1, 50-2, 50-3 and 50-4 and the corresponding region of the induction conductor 12 so that a capacitance $C_1$, $C_2$, $C_3$ or $C_4$ therebetween can be increased.

Although the fifth embodiment shown in FIG. 9 has been described as to a modication of the first embodiment shown in FIG. 1, such a modification may be applied similarly to the second through fourth aforementioned embodiments.

The capacitance C may be further increased by substantially increasing that area of the substrate to be formed with each of the induction conductor regions and also that portion of the substrate to be formed with each of the grounding block conductors 50 as by previously forming irregularities on the substrate surface through etching or the other suitably means.

Sixth Embodiment

By suitably selecting the material of the substrate 10 in addition to the number of windings in the induction conductor 12 and the number of grounding block conductors 50, the inductance L and capacitance C in the LC noise filter may be set at any suitable level.

For example, when it is desired to increase the inductance C in the LC noise filter, the substrate 10 may be preferably made of magnetic material. If it is desired to increase the capacitance C in the LC noise filter, the substrate 10 may be preferably made of any suitable material having its higher dielectric constant, such as ceramics or the like. If it is desired to increase both the inductance and capacitance, the substrate 10 may be preferably made of magnetic material having its higher dielectric constant.

Alternatively, a noise filter as formed according to one of the first through fifth embodiments may be housed in a housing forming a magnetic circuit to increase the inductance L.

Figure 10:
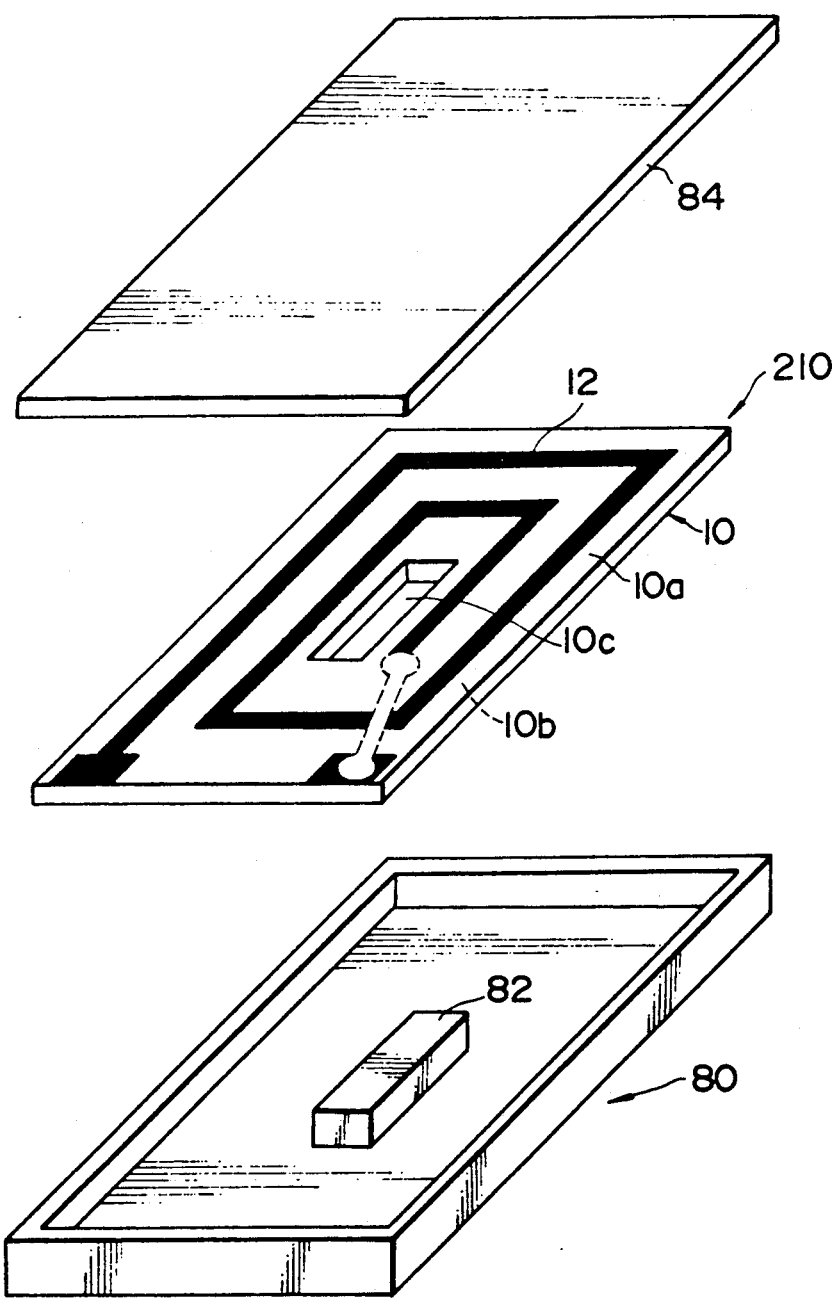
FIG. 10 illustrates the sixth preferred embodiment of an LC noise filter constructed according to the present invention and using a housing.

FIG. 10 shows an example of such noise filters as just now described, wherein a noise filter 210 as shown in FIGS. 1 through 9 is received within a housing 80 formed of a magnetic material.

The substrate 10 is formed with a core passing aperture 10c substantially at the center thereof. The housing 80 includes a core 82 formed therein at the center thereof, which core 82 extends through the aperture 10c. When the housing 80 is closed by a lid 84, a magnetic closed path is formed among the core 82, housing 80 and lid 84.

In such a manner, there can be provided an LC noise filter which has a sufficiently large inductance.

Although the sixth embodiment has been described as to the magnetic closed path, the present invention is not limited to such as arrangement and may be applied to a housing for providing a magnetic open path, if desired.

Figure 11:
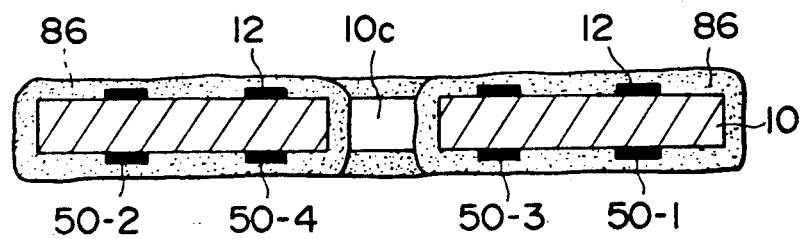
FIG. 11 illustrates an LC noise filter including a magnetic closed circuit in which a magnetic body is painted by magnetic powdered material.

FIG. 11 shows a noise filter including a substrate 10 which is covered with a magnetic powder.

The substrate 10 includes a core passing aperture 10c formed therein substantially at the center. The opposite sides of the substrate 10 are fully covered with a magnetic powder except the core passing aperture 10c. The powder layer 86 forms a magnetic closed path for greatly reducing the external leakage of a magnetic flux created therein.

Thus, if a plurality of such noise filters are arranged to provide a multi-channel noise filter assembly, there will not be created any interference such as ringing between adjacent noise filters.

PC Board

As will be apparent from the first through fifth embodiments, the present invention can provide a distributed constant type LC noise filter improved in electrical characteristics by utilizing the opposite sides of an insulative substrate 10. If a PC board is used to provide an insulative substrate 10, any number of distributed constant type LC noise filters may be provided on the PC board without increase of the thickness of the PC board itself. Such an arrangement is very suitable for various electronic instruments which are being increasingly required to decrease their size and weight. If a noise filter assembly is formed on a PC board, the entire system may be greatly reduced in thickness and weight, in comparison with the prior art chip-type noise filters. The PC board may take a film or sheet configuration other than the conventional substrate configuration, if required.

If the distributed constant type LC noise filter is used in lap-top type computer, the latter may be further reduced in size and weight.

Where it is to use a PC board for an IC card in which the prior art noise filter could not mounted due to limitation of required thickness, any number of LC noise filters may be simply mounted in the IC according to the present invention.

The distributed constant type LC noise filter constructed according to the principle of the present invention may be easily mounted on PC boards for various applications without increase of the thickness thereof since the LC noise filter can be formed on the PC board simply by printing.

Figure 12:
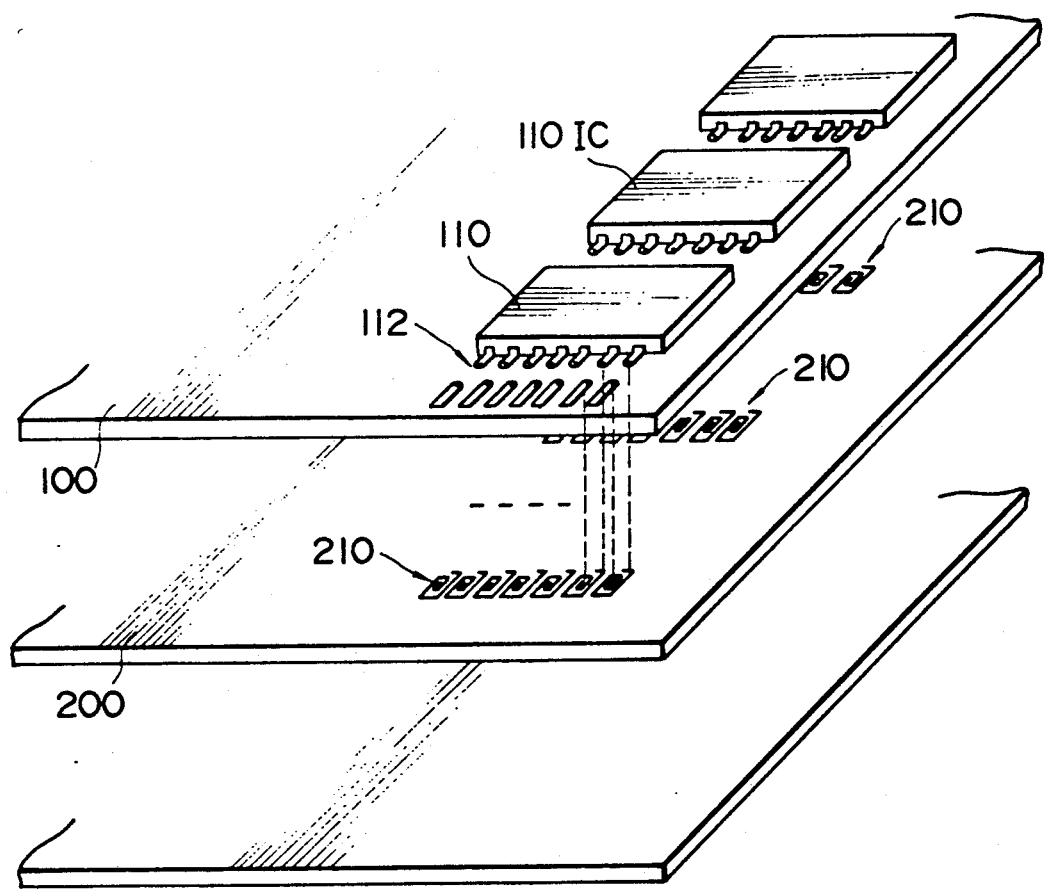
FIG. 12 illustrates a multi-channel noise filter system which comprises a plurality of PC boards placed one over another and noise filters disposed on one of the PC boards and constructed according to one of the first to fifth embodiments of the present invention.

FIG. 12 shows a preferred embodiment of the present invention in which a multi-channel noise filter for signal lines is formed on a PC board. A plurality of integrated circuits 110 are mounted on the PC board 100. Each of the integrated circuits 110 includes a signal line 112 connected with the substrate 110.

The PC board 110 is placed over another PC board 200 on which a plurality of LC noise filters 210, each constructed according to either of the first through fifth embodiments, are located at positions corresponding to input and output leads 112 of each integrated circuit 110 to form a multi-channel noise filter assembly. The LC noise filters 210 may be formed on the PC board 200 simply by printing or by other suitable means. Thus, the size, inductance L and capacitance C of the multi-channel noise filter assembly may be suitably set for a reduced space.

The PC boards 200 thus formed are placed one above another under the PC board 100 and electrically connected with the leads 112 of the integrated circuits 110 on the top PC board 100.

In such a manner, an electronic instrument may be reduced in size and weight as a whole by forming a multi-channel noise filter assembly on the board 200 without increase of the thickness thereof.

Although the just described embodiment has been described as to the multi-channel noise filter assembly 210 on the PC board 200 separately from the PC board 100 on which the integrated circuits 110 are provided, the present invention is not limited to such an arrangement and may be applied similarly to a multi-channel noise filter assembly 210 which is mounted on the PC board 100 if there is a sufficient space among the integrated circuits 110.

Although this embodiment has been described as to the multi-channel noise filter for signal lines on the PC board 200, the present invention may be applied similarly to a noise filter for a power line, if required.

Figure 13:
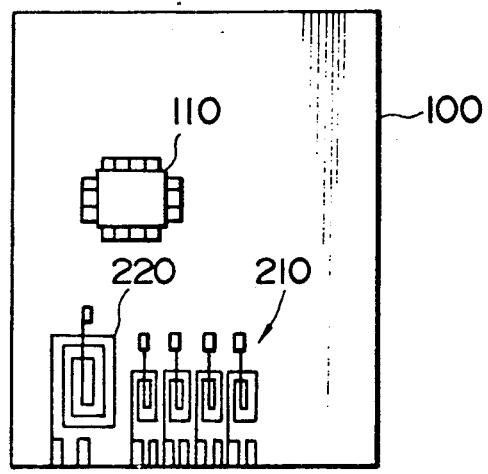
FIG. 13 illustrates a PC board on which an integrated circuit, a multi-channel noise filter for signal lines and a noise filter for a power line are mounted, these noise filters being constructed according to the present invention.

FIG. 13 illustrates a modified embodiment of the present invention which comprises a multi-channel noise filter assembly 210 for signal lines and a noise filter for a power line, all of which are formed in a PC board 100 on which an integrated circuit 110 is mounted. Such a PC board 100 is very suitable for an IC card. If there is a plurality of integrated circuits 110 on the PC board 100, the noise filter 220 for power line may be formed into a multi-channel noise filter for the number of integrated circuits 110.

Particularly, in a portable instrument having no grounding housing such as an IC card, each of the LC noise filters used should preferably be a common mode type noise filter as shown in the fourth embodiment of the present invention aforementioned.

Figure 14:
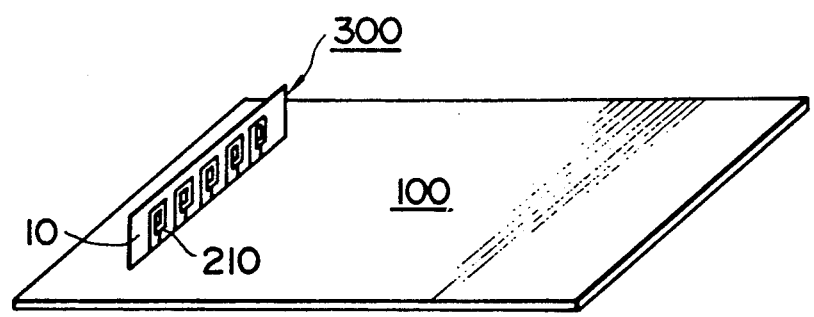
FIG. 14 illustrates a PC board including an elongated insulative substrate mounted thereon, on which a multi-channel noise filter is formed according to the present invention.

FIG. 14 shows a multi-channel noise filter assembly 300 comprising a plurality of noise filters as shown in the first through fifth embodiments which are formed on a rectangular shaped insulative substrate 100.

The multi-channel noise filter assembly 300 may be simply mounted on a PC board 100 as in the conventional electronic parts and used for integrated circuits and the other applications. If the insulative substrate 10 is in the form of a film, the film-like insulative substrate 10 on which a multi-channel noise filter assembly is formed may be mounted on the PC board 100 in the horizontal position, rather than the vertical position as shown in FIG. 14. This can result in further reduction of the thickness of the PC board 100 so that the latter can be located in a smaller space limited in thickness.

The noise filter of the present invention may be not only applied to signal lines, but also to power lines, for example, for integrated circuits. As described previously, the insulative substrate used in the present invention may be of any type such as film, sheet and others.

The present invention is not limited to the previously described embodiments, but may be applied in various modifications within the scope of the invention.

For example, if a single noise filter constructed according to the principle of the present invention is to be formed as a SMD type component, it may be believed that the single noise filter cannot provide necessary inductance L and necessary capacitance C. In such a case, a plurality of such noise filters may be connected in parallel or series with one another to provide an LC noise filter assembly having desired inductance and capacitance.

If a number of grounding block conductors are provided in an LC noise filter according to the present invention, a problem may be raised in the manner in which each of the block conductors is connected with the ground terminal.

Figure 15A:
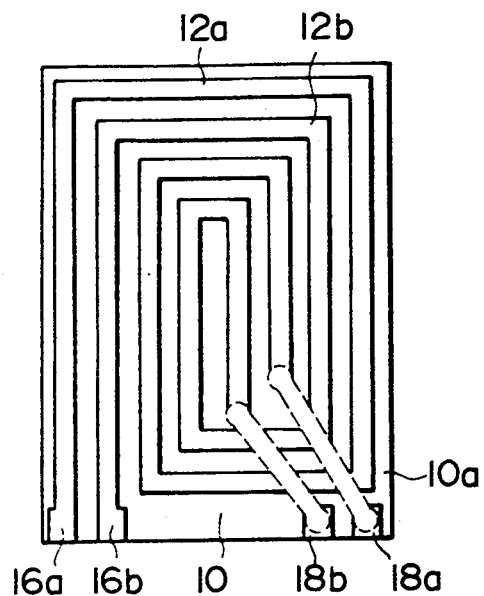
FIGS. 15(A)–15(D) illustrate a further embodiment of the present invention.
Figure 15B:
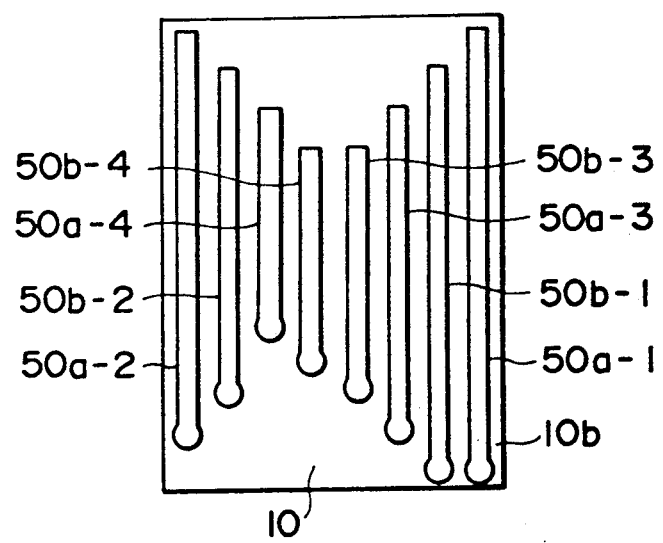
Figure 15C:
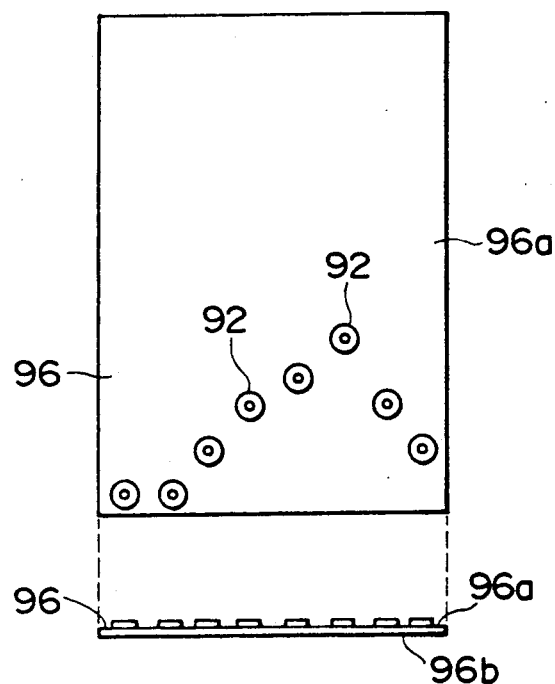
Figure 15D:
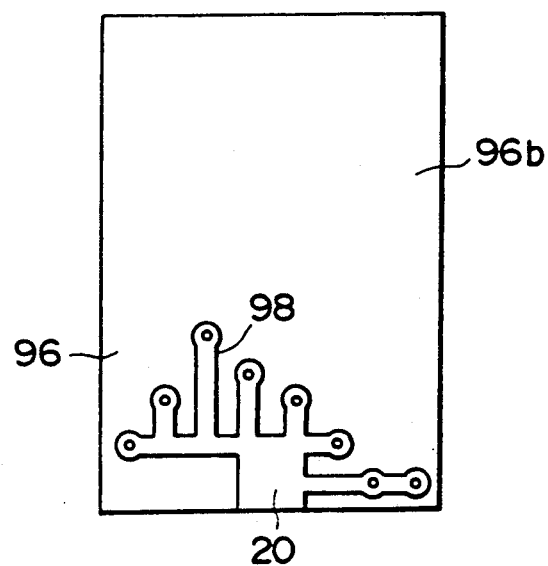
Figure 16A:
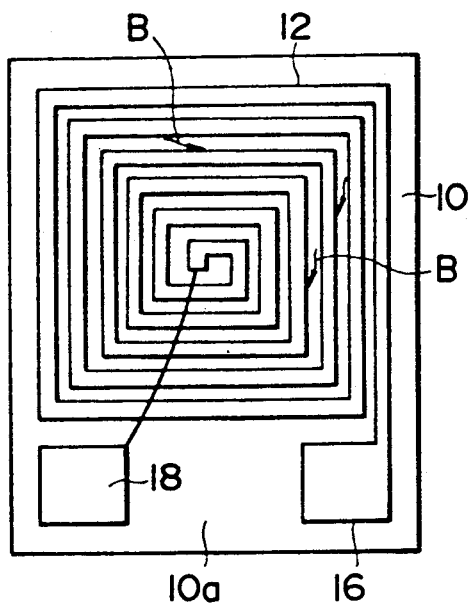
FIGS. 16A and 16B illustrate one of the conventional noise filters.
Figure 16B:
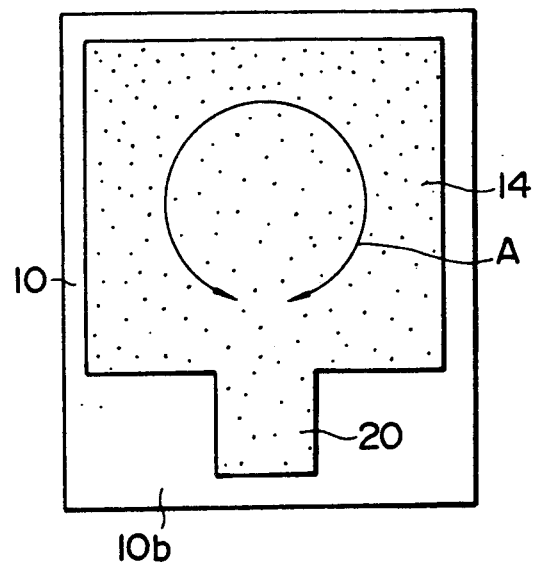
Figure 17:
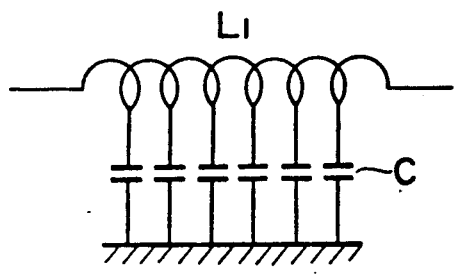
FIGS. 17 and 18 illustrate two equivalent circuits usable in the noise filter which is shown in FIG. 16.
Figure 18:
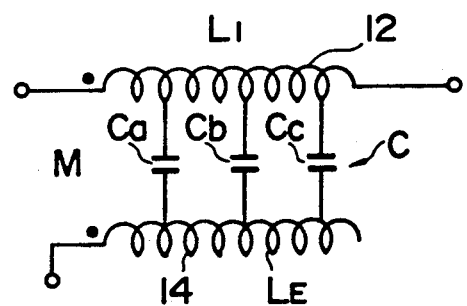

As seen from FIGS. 15A and 15B, such a problem can be overcome by providing a pair of induction conductors 12a and 12b on an insulative substrate 10 at one side 10a, a plurality of grounding block conductors 50 on the same insulative substrate at the other side 10b and an auxiliary substrate 96. The auxiliary substrate 96 includes a plurality of electrodes 92 formed thereon at one side 96a, each of which is in contact with the corresponding one of the block conductors 50. The auxiliary substrate 96 also includes leads 98 formed thereon at the other side 96b, each of which leads is connected between the corresponding one of the electrodes 92 and the ground terminal 20 through the corresponding one of through-holes. The auxiliary substrate 96 is placed over the substrate 10 with the side 96a being faced on the side 10b. Such an assembly is then subjected to dipping.

Even if a number of grounding block conductors 50 are used in the LC noise filter, they may be easily and simply connected with the ground terminal 20.

In addition to the prevention of the induction conductor or conductors from creating the line-to-line short-circuit by the use of a shield conductor or conductors, the present invention can effectively prevent the line-to-line short-circuit by coating one or both of the opposite sides 10a and 10b of the substrate 10 with an insulative shield layer or layers.

If the substrate 10 is made of such a material as high-frequency absorbing and heating body, noise may be more effectively eliminated by absorbing noise and particularly high-frequency noise from signals passing through the induction conductor 12 as heat.

In order to prevent a lightning surge, the substrate 10 may be preferably made of ceramic material used in varister, if required.

The induction, shield and grounding block conductors 12, 40 and 50 may be formed to be magnetic and also conductive by depositing magnetic layers on their surfaces as by plating such that the magnetic reluctance will be reduced to increase the inductance in the induction conductor 12.

Although the embodiments of the present invention have been described as to the flat substrate 10 used as a dielectric, the present invention is not limited to the flat substrate, but may be applied similarly to any one of various sleeve-like dielectrics having cylindrical, square and other cross-sections. A sleeve-like dielectric may be formed with a plurality of spiral grooves on either of the external or internal wall thereof. An induction conductor may be located within each of such spiral grooves. Induction conductors may be formed on the external and internal walls of the sleeve.

As will be apparent from the foregoing, the present invention provides an LC noise filter which comprises a dielectric, at least one induction conductor formed thereon at one side and at least one grounding block conductor formed on the dielectric at the other side and opposed to the corresponding part of the induction conductor, whereby a separate capacitor can be formed between the induction conductor and each of the grounding block conductors. Thus, the LC noise filter can function as a distributed constant type LC noise filter improved in inductance and capacitance.

In accordance with the present invention, furthermore, a distributed constant type LC noise filter having any desired capacitance can be easily provided by increasing or decreasing the number of grounding block conductors.

By providing a shield conductor between each adjacent wind of the swirl-like induction conductor to prevent the line-to-line short-circuit, the present invention can provide a distributed constant type LC noise filter which can more effectively eliminate noise components without production of the line-to-line short-circuit even through a high-frequency band.

I claim:

1. An LC noise filter comprising:
  a dielectric material having two sides;
  swirled induction conductor means formed on said dielectric material at one side; and
  at least one grounding block conductor means disposed along said induction conductor means and formed at a position opposed to only a portion of said induction conductor means.

2. An LC noise filter as defined in claim 1 wherein said dielectric material is formed into a substrate and wherein said induction conductor means is formed on said substrate at one side and said grounding blok conductor means is formed on said substrate at the other side in a position opposed to a portion of said induction conductor means.

3. An LC noise filter as defined in claim 2 wherein said induction conductor means has an input terminal and an output terminal and a plurality of grounding block conductor means are provided, one of said grounding block conductor means being disposed close to one of the input and output terminals in said induction conductor means and wherein a ground lead is connected with said one grounding block conductor means at a position near the input or output terminal.

4. An LC noise filter as defined in claim 2 wherein said grounding block conductor means includes a first block conductor disposed close to the input terminal of said induction conductor means and connected with said ground lead at a position near said input terminal and a second block conductor arranged close to the output terminal of said induction conductor means and connected with said ground lead at a position near said output terminal.

5. An LC noise filter as defined in said claim 4 wherein said grounding block conductor means includes at least one additional block conductor arranged at a position opposed to a portion of said induction conductor means.

6. An LC noise filter as defined in claim 2 wherein said induction conductor means has portions of varying widths, said portion of said induction conductor means opposed to the corresponding one of said groundng block conductor means having a width layer than the width of the remaining portions of said induction conductor means, so as to increase a capacitance therebetween.

7. An LC noise filter as defined in claim 1 wherein said induction conductor means includes at least two adjacent induction conductors formed on said dielectric material at one side to provide a common mode type LC noise filter.

8. An LC noise filter as defined in claim 2 wherein said induction conductor means includes at least two adjacent induction conductors formed on said substrate at one side to provide a common mode type LC noise filter.

9. An LC noise filter comprising:
a dielectric material having two sides;
swirled induction conductor means formed on said dielectric material at one side; and
at least one grounding block conductor means formed on said dielectric material at the other side in a position opposed to only a portion of said induction conductor means, wherein shield conductor means is located between adjacent winds of said induction conductor means to prevent a line-to-line short-circuit in said induction conductor means.

10. An LC noise filter comprising:
a dielectric material having two sides;
swirled induction conductor means formed on said dielectric material at one side; and
at least one grounding block conductor means formed on said dielectric material at the other side in a position opposed to only a portion of said induction conductor means,
wherein said dielectric material is formed into a substrate and wherein said induction conductor means is formed on said substrate at one side and said grounding block conductor means is formed on said substrate at the other side in a position oppose to a portion of said induction conductor means; and
shield conductor means located between adjacent winds of said induction conductor means to prevent a line-to-line short-circuit in said induction conductor means.

11. An LC noise filter as defined in claim 10 wherein said substrate includes a through-hole formed therein and wherein said shield conductor means has an inner end which is electrically connected with said grounding block conductor means on the opposite side of said substrate through said through-hole.

12. An LC noise filter comprising:
a dielectric material having two sides;
swirled induction conductor means formed on said dielectric material at one side; and
at least one grounding block conductor means formed on said dielectric material at the other side in a position opposed to only a portion of said induction conductor means,
wherein said grounding block conductor means includes at least one additional block conductor arranged at a position opposed to a portion of said induction conductor means, wherein said induction conductor means includes at least two adjacent induction conductors formed on said substrate at one side and wherein shield conductor means is provided between adjacent winds of each of said induction conductors to prevent a line-to-line short-circuit, said shield conductor means having an inner end which is electrically connected with said grounding block conductor means on the opposite side of said substrate through through-hole means formed on said substrate.

13. An LC noise filter as defined in claim 2, wherein said substrate includes a central through-hole formed therein and wherein a magnetic path of said induction conductor means is formed on the surface of said substrate by the inclusion of a magnetic material on said substrate surface.

14. An LC noise filter as defined in claim 2 wherein said substrate includes a substantially central core passing aperture formed therein and further comprising a magnetic housing having one opended end and adapted to receive said insulative substrate, a magnetic core passing through said core passing aperture in said substrate to form a magnetic path between said magnetic core and said magnetic housing and a magnetic lid covering said one opened end of said housing to form the magnetic path between said magnetic core and said magnetic housing, whereby a magnetic closed path can be formed in said induction conductor means.

15. An LC noise filter as defined in claim 1 wherein said dielectric material absorbs electromagnetic waves and generate heat.

16. A multi-channel noise filter system comprising:
a substrate formed of a dielectric material and having two sides; and
a plurality of LC noise filters disposed on said substrate at positions close to each other, each of said LC noise filters comprising:
swirled induction conductor means disposed along said induction conductor means and formed at a position opposed to only a portion of said induction conductor means.

17. A multi-channel noise filter as defined in claim 16 wherein said induction conductor means has an input terminal and an output terminal and said grounding block conductor means includes a plurality of grounding block conductors, one of said grounding block conductors being arranged close to one of the input and output terminals in said induction conductor means and connected with a ground lead at a position near said input or output terminal.

* * * * *